(12) United States Patent
Aipperspach et al.

(10) Patent No.: US 7,764,531 B2
(45) Date of Patent: Jul. 27, 2010

(54) IMPLEMENTING PRECISE RESISTANCE MEASUREMENT FOR 2D ARRAY EFUSE BIT CELL USING DIFFERENTIAL SENSE AMPLIFIER, BALANCED BITLINES, AND PROGRAMMABLE REFERENCE RESISTOR

(75) Inventors: Anthony Gus Aipperspach, Rochester, MN (US); Toshiaki Kirihata, Poughkeepsie, NY (US); Phil Christopher Felice Paone, Rochester, MN (US); Brian Joy Reed, Rochester, MN (US); John Matthew Safran, Wappingers Falls, NY (US); David Edward Schmitt, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 12/212,738

(22) Filed: Sep. 18, 2008

(65) Prior Publication Data
US 2010/0067319 A1 Mar. 18, 2010

(51) Int. Cl.
*G11C 17/00* (2006.01)
(52) U.S. Cl. .................. 365/96; 365/202; 365/210.01; 365/225.7
(58) Field of Classification Search ................ 365/96, 365/202, 210.01, 227.5
See application file for complete search history.

(56) References Cited

U.S. PATENT DOCUMENTS

| | | | |
|---|---|---|---|
| 2004/0174190 A1* | 9/2004 | Li et al. | 327/55 |
| 2005/0247996 A1* | 11/2005 | Chung et al. | 257/529 |
| 2008/0217734 A1* | 9/2008 | Lin et al. | 257/529 |

OTHER PUBLICATIONS

U.S. Appl. No. 12/029,010, filed February 11, 2008 by Anthony Gus Aipperspach et al., and entitled "Method and Circuit for Implementing Enhanced Efuse Sense Circuit".

* cited by examiner

*Primary Examiner*—Hoai V Ho
(74) *Attorney, Agent, or Firm*—Joan Pennington

(57) ABSTRACT

A method and circuit for implementing precise eFuse resistance measurement, and a design structure on which the subject circuit resides are provided. An eFuse sense amplifier coupled to an eFuse array and used for current measurements includes balanced odd and even bitlines, and a plurality of programmable reference resistors connected to the balanced odd and even bitlines. First a baseline current measurement is made through one of the programmable reference resistors, and used to identify a network baseline resistance. A current measurement is made for an eFuse path including a selected eFuse and used to identify the resistance of the selected eFuse.

20 Claims, 4 Drawing Sheets

IMPLEMENTING PRECISE RESISTANCE MEASUREMENT FOR 2D ARRAY EFUSE BIT CELL USING DIFFERENTIAL SENSE AMPLIFIER, BALANCED BITLINES, AND PROGRAMMABLE REFERENCE RESISTOR

FIELD OF THE INVENTION

The present invention relates generally to the data processing field, and more particularly, relates a method and circuit for implementing precise eFuse resistance measurement, and a design structure on which the subject circuit resides.

DESCRIPTION OF THE RELATED ART

Electronic Fuses (eFuses) are currently used to configure elements after the silicon masking and fabrication process. These fuses typically are used to configure circuits for customization or to correct silicon manufacturing defects and increase manufacturing yield.

In very large scale integrated (VLSI) chips, it is common to have fuses, such as eFuses that can be programmed for various reasons. Among these reasons include invoking redundant elements in memory arrays for repairing failing locations or programming identification information.

Currently there is no precise method for measuring the resistance of fuses in an eFuse array or 2D eFuse architecture. When a fuse is sensed, both the sense amplifier and the blown fuse resistance must be within the specification to ensure the proper value is read out.

When an eFuse is blown the final resistance of the eFuse has a distribution depending upon how well electromigration has occurred. How well electromigration occurs depends upon the amount voltage across the eFuse and amount of current through the eFuse.

Due to process, voltage, and current variation typically when an eFuse does not blow correctly this results in a resistance, which is lower than expected. This lower resistance causes a problem in the ability to accurately sense if an eFuse is blown or not. Lower resistance of a blown eFuse is also a reliability concern.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

A need exists for a circuit for implementing precise eFuse resistance measurement. It is desirable to provide such a circuit that effectively implements precise eFuse resistance measurement for an eFuse array or 2D eFuse architecture.

SUMMARY OF THE INVENTION

Principal aspects of the present invention are to provide a method and circuit for implementing precise eFuse resistance measurement, and a design structure on which the subject circuit resides. Other important aspects of the present invention are to provide such method and circuit for implementing precise eFuse resistance measurement substantially without negative effect and that overcome many of the disadvantages of prior art arrangements.

In brief, a method and circuit for implementing precise eFuse resistance measurement, and a design structure on which the subject circuit resides are provided. An eFuse sense amplifier coupled to an eFuse array and used for current measurements includes balanced odd and even bitlines, and a plurality of programmable reference resistors connected to the balanced odd and even bitlines. First a baseline current measurement is made through one of the programmable reference resistors, and used to identify a network baseline resistance. A current measurement is made for an eFuse path including a selected eFuse and used to identify the resistance of the selected eFuse.

In accordance with features of the invention, the voltage is divided by this current to give a base resistance for the entire network from a voltage supply rail to ground. The resistance of the programmable reference resistor is subtracted from this baseline number to identify a baseline resistance. The voltage is divided by the measured current of the eFuse path to identify the path resistance of the network including the selected eFuse. The baseline resistance is subtracted to yield the resistance of the selected eFuse.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and circuit are provided for precise eFuse resistance measurement, which is an important diagnostic for the eFuse technology. This method and circuit assist in measuring the programmability of the eFuses, that is how well the eFuses are programmed. This method and circuit assist as well for failure analysis, for example, if the eFuse is reading or sensing as unblown while the eFuse really has been programmed, measuring the resistance helps determine how the sense structure should be reading the eFuse.

In accordance with features of the invention, the method and circuit provide measurement of eFuse resistance indirectly using measurement of the current through the eFuse at a set voltage and Ohm's Law. A sense amplifier for implementing the invention includes a plurality of programmable reference resistors.

In accordance with features of the invention, a baseline current measurement is made through one of the programmable reference resistors. Dividing a set voltage by this current gives a base resistance for the entire network from a set voltage supply rail to ground. A resistance of the programmable reference resistor is subtracted from this baseline number. A new current measurement is made for a selected eFuse path including the desired eFuse. Dividing the voltage applied by the measured eFuse path current renders the resistance of the network including the eFuse. Subtracting the baseline resistance yields the resistance of the selected eFuse.

In accordance with features of the invention, the resistance of each programmable reference resistor of the sense amplifier is trustworthy because the process tolerance of resistors in current technology is much tighter than a dummy eFuse. Also, this path is trustworthy as a baseline measurement because the sense amplifier path is balanced for wire and load.

Figure 1:
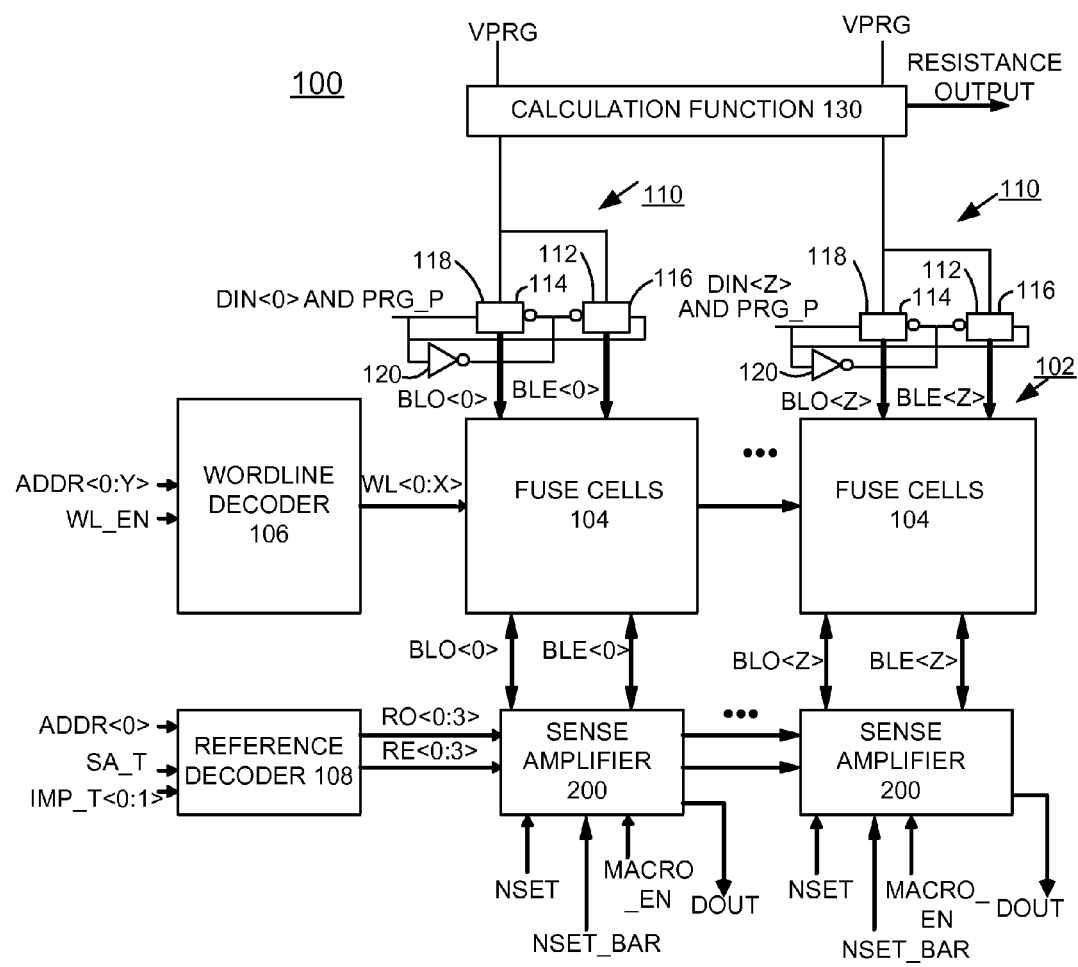
FIG. 1 is a schematic diagram illustrating an exemplary eFuse resistance measurement circuit for implementing eFuse resistance measurement in accordance with the preferred embodiment.

Having reference now to the drawings, in FIG. 1, there is shown an exemplary eFuse resistance measurement circuit generally designated by the reference character 100 in accordance with the preferred embodiment. The eFuse resistance measurement circuit 100 includes an eFuse array 102 including a plurality of eFuse cells 104. The eFuse resistance measurement circuit 100 includes a wordline decoder 106 receiving an enable input WL_EN, and an address input ADDR<0:Y>. The wordline decoder 106 provides a wordline input WL<0:X> to address the multiple eFuse cells 104.

The eFuse resistance measurement circuit 100 includes a reference decoder 108 receiving a control enable input SA_T, an odd and even programmable reference resistor select input IMP_T<0:1> and an address input ADDR<0> to select a reference resistor for current measurement. The reference decoder 108 provides an odd reference resistor select input RO<0:3> and an even reference resistor select input RE<0:3> to address reference resistors connected to the even and odd bitline BLO, BLE of each respective sense amplifier 200 coupled to multiple eFuse cells 104. An exemplary eFuse sense amplifier 200 for implementing eFuse resistance measurement in accordance with the preferred embodiment is illustrated and described with respect to FIG. 2.

The eFuse resistance measurement circuit 100 includes a bitline decoder 110 receiving a control enable input PRG_P and a respective bitline select input DIN<0> through DIN<Z>. The bitline decoder 110 includes a transmission gate defined by a parallel connected pair of series connected P-channel field effect transistors (PFETs) 112, 114 and pair of series connected N-channel field effect transistors (NFETs) 116, 118 connected to a voltage supply rail VPRG. The control enable input PRG_P is ANDED with the respective bitline select input DIN<0> through DIN<Z> and applied to a gate of NFETs 116, 118, and to an inverter 120 inverted and applied to a gate of PFETs 112, 114. Each bitline decoder 110 applies a respective odd and even bitline select BLO<0>, BLE<1> through BLO<Z>, BLE<Z> to address the multiple eFuse cells 104 of the eFuse array 104.

The eFuse resistance measurement circuit 100 includes a calculation function 130 used for identifying a network baseline resistance from a current measurement through a selected reference resistor with no eFuse selected and then identifying a resistance of a selected eFuse using a measured eFuse current through a selected eFuse and the network baseline resistance.

Figure 2:
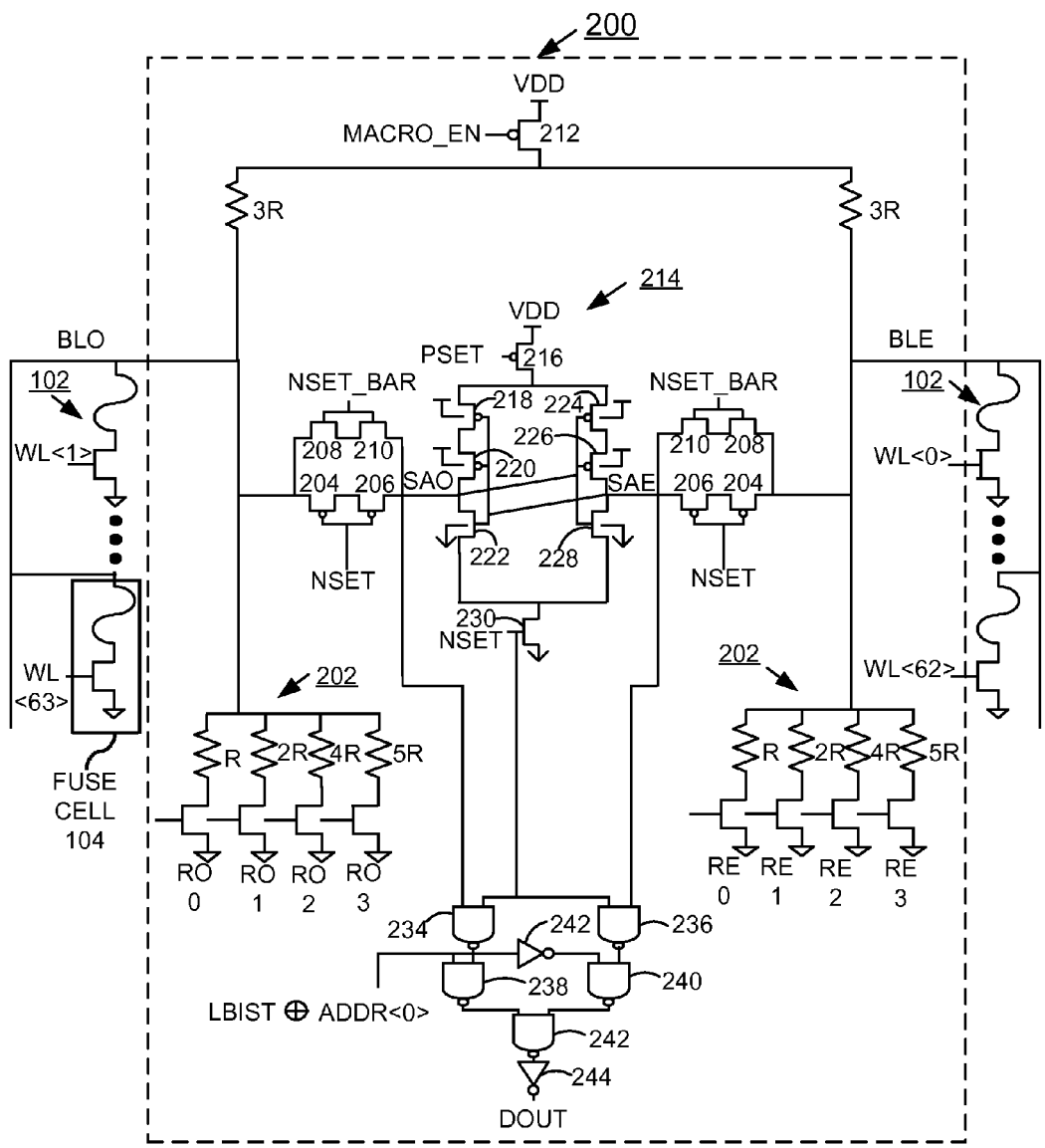
FIG. 2 is a schematic diagram illustrating an exemplary eFuse sense amplifier circuit of the eFuse resistance measurement circuit of FIG. 1 for implementing eFuse resistance measurement in accordance with the preferred embodiment.

Referring now to FIG. 2, sense amplifier 200 includes odd and even bitlines BLO, BLE. The bit lines BLE, BLO attached to the sense amplifier 200 are balanced with respect to each other. On each side of the sense amplifier 200 there are a plurality of programmable reference resistors generally designated by reference character 202 and labeled R, 2R, 4R, 5R. A respective odd reference resistor select input RO0, RO1, RO2, RO3 shown as RO<0:3> in FIG. 1, and an even reference resistor select input RE0, RE1, RE2, RE3 shown as RE<0:3> in FIG. 1, is applied to an associated control NFET to the address reference resistors R, 2R, 4R, 5R connected to the odd and even bitline BLO, BLE. The respectively activated NFET selects a particular reference resistor R, 2R, 4R, 5R having a predetermined reference resistor value, such as 1K ohm, 2K ohm, 4K ohm and 5K ohm.

Sense amplifier 200 includes a respective transmission gate defined by a parallel connected pair of series connected P-channel field effect transistors (PFETs) 204, 206 and pair of series connected N-channel field effect transistors (NFETs) 208, 210 connected to the respective even and odd bitline BLE, BLO and a respective sensing node SAE, SAO. The PFETs 204, 206 receive a gate input control signal NSET and the NFETs 208, 210 receive a gate input control signal NSET_BAR. Sense amplifier includes a respective pull-up resistor labeled 3R, connected to the odd and even bitline BLO, BLE and a macro enable PFET 212 receiving a gate input control signal PSET. Each respective pull-up resistor 3R has a predetermined resistor value, such as 3K ohm.

As shown in FIG. 2, the eFuse array 102 includes, for example, a 64-bit column of eFuses or fuse cells 0-63 connected to the bitlines BLE, BLO on each side of the sense amplifier 200. As shown in FIG. 2, each of the eFuses or fuse cell 104 includes a series connected eFuse and a select transistor receiving a respective wordline input WL<0:X>. Thirty-two (32) even fuse cells 104 from an eFuse cell 0 receiving a wordline input WL<0> to an eFuse cell 62 receiving a wordline input WL<62> are connected to the even bitline BLE; and 32 odd eFuse cells 104 from eFuse cell 1 receiving a wordline input WL<1> to eFuse cell 63 receiving a wordline input WL<63> are connected to the odd bitline BLO.

Sense amplifier 200 includes a sensing circuit generally designated by reference character 214 connected to the sensing nodes SA0, SA1 including a header PFET 216 connected between the voltage supply VDD and a pair of cross-coupled inverters, as shown. A pair of series connected PFETs 218, 220 and an NFET 222, and a pair of series connected PFETs 224, 226 and an NFET 228 respectively form the cross-coupled inverters. Sensing circuit 214 includes a pull-down NFET 230 connecting NFETs 222, 228 to ground. A respective NAND gate 234, 236 is coupled to the respective sensing node SA0, SA1 and includes a second input connected to the control input NSET. The NAND gates 234, 236 provide a first input to a respective second NAND gate 238, 240, which receive a second test input of logic built in self test (LBIST) input signal LBIST ANDed with an address signal ADDR<0>. A respective output of NAND gates 238, 240 is applied to a NAND gate 242. The output of NAND gate 242 is applied to an inverter 244 driving an output DOUT of the sense amplifier 200.

Figure 3:
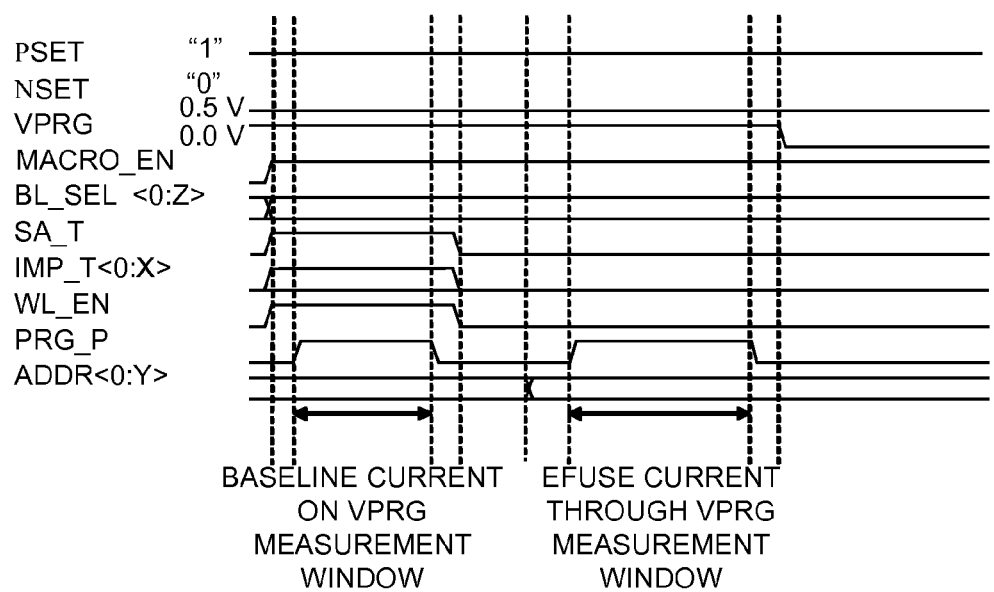
FIG. 3 illustrates an exemplary timing chart for implementing eFuse resistance measurement in accordance with the preferred embodiment.

Referring now to FIG. 3, there is shown an exemplary timing chart for implementing eFuse resistance measurement in accordance with the preferred embodiment. The operation of measuring eFuse resistance is similar to that of fuse blow or programming. However, a base current measurement on voltage rail VPRG at some small set voltage value, such as, 0.1V, 0.2V, or 0.5V is made through a reference resistor R, 2R, 4R, 5R, with no eFuses selected. The set voltage VPRG is divided by the measured current to get a base resistance. This is the resistance of the entire network from the VPRG pin to ground. The reference resistor is relatively process intolerant and can be subtracted from this value yielding the baseline network resistance. Afterwards, a blow-type operation is performed but VPRG is still held at some small value (0.1V/0.2V/0.5V) incapable of blowing the fuse. Measure the current on VPRG. Again, divide VPRG by the current to get the resistance of the network with the fuse in it. By subtracting the baseline network resistance from the fuse network resistance the fuse resistance is obtained.

Referring to FIG. 3, steps are performed for implementing eFuse resistance measurement in accordance with the preferred embodiment as follows:

Set all inputs to inactive states, PSET to VDD, NSET to GND. Then Set VPRG to selected set voltage, such as 0.1V, 0.2V, or 0.5V. Set MACRO_EN to VDD, set WL_EN to deactivate the WL decoder, set BL_SEL<0:z> to select the single bitline containing the fuse to have its resistance measured, raise SA_T to VDD, set IMP_T<0:x> to select the reference resistor to measure current through. Raise PRG_P to VDD and measure current on VPRG or I reference network. Divide VPRG by I reference network to get R reference network. Subtract the resistance of the reference resistor to get R baseline.

Lower PRG_P to GND. Set WL_EN to activate the WL decoder. Set ADDR<0:Y> to select the wordline containing the single eFuse to have its resistance measured. Raise PRG_P to VDD and measure current on VPRG, I fuse network. Divide VPRG by I fuse network to get R fuse network. R fuse=R fuse network-R baseline. Lower PRG_P to GND. Lower VPRG to GND. These steps are then repeated to determine resistance on other eFuses 104 in the eFuse array 102.

Figure 4:
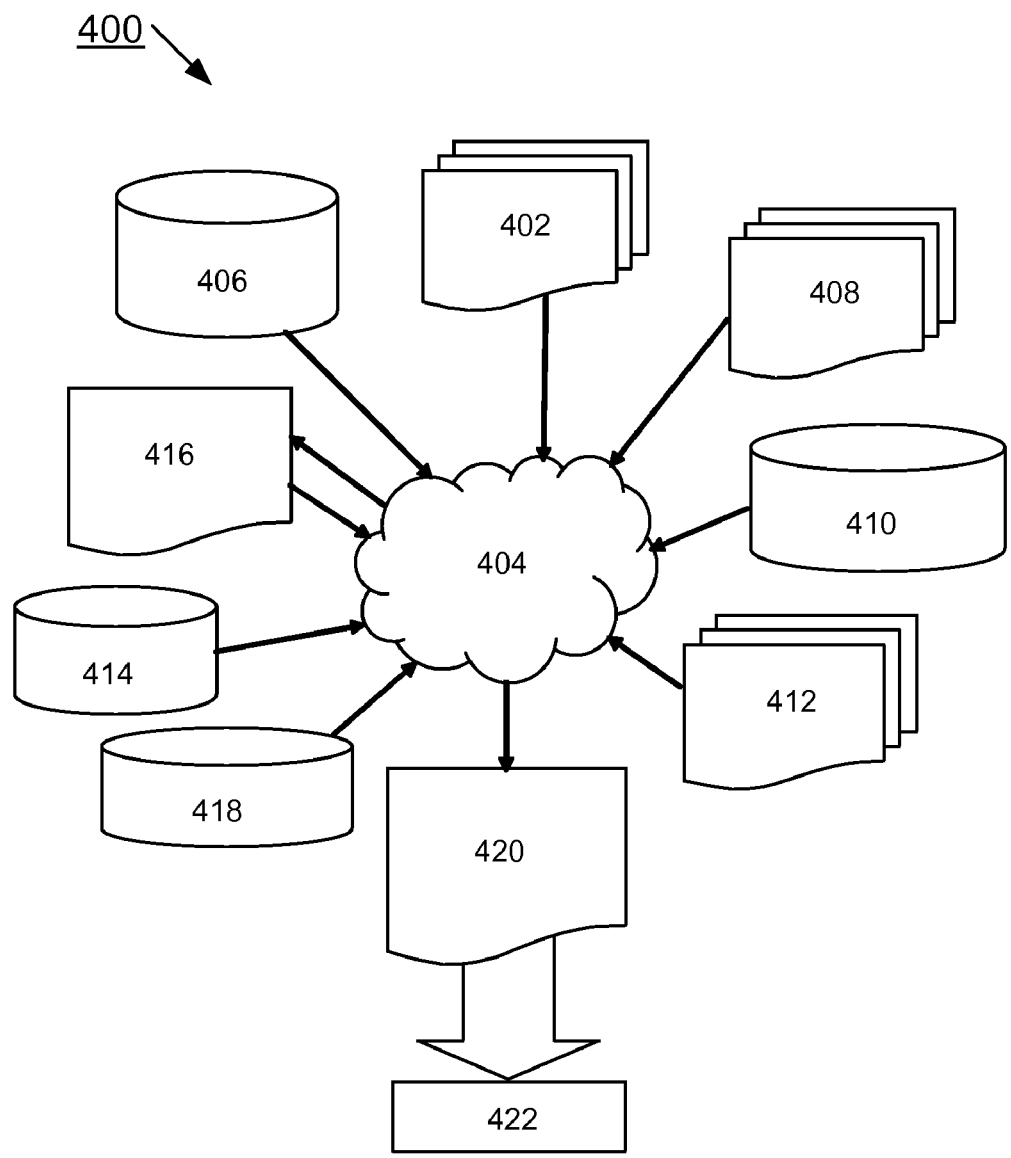
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 100, 200 in the form of schematics or HDL, a hardware-description language, for example, Verilog, VHDL, C, and the like. Design structure 402 may be contained on one or more machine readable medium. For example, design structure 402 may be a text file or a graphical representation of circuits 100, 200. Design process 404 preferably synthesizes, or translates, circuits 100, 200 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, and 2 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, and 2. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing precise eFuse resistance measurement with an eFuse array comprising:

providing an eFuse sense amplifier coupled to the eFuse array including balanced odd and even bitlines and a plurality of programmable reference resistors coupled to the balanced odd and even bitlines, using said eFuse sense amplifier for current measurements;

measuring a baseline current through a selected one of said programmable reference resistors, identifying a network baseline resistance using the measured baseline current;

measuring an eFuse current through an eFuse path including a selected eFuse;

identifying a resistance of the selected eFuse using the measured eFuse current and said network baseline resistance.

2. The method for implementing precise eFuse resistance measurement as recited in claim 1 wherein measuring a baseline current through a selected one of said programmable reference resistors includes applying a set voltage to a network including the eFuse array with no eFuse selected.

3. The method for implementing precise eFuse resistance measurement as recited in claim 2 wherein identifying a network baseline resistance using the measured baseline current includes dividing the set voltage by the measured baseline current to provide a base resistance for the network from a voltage supply rail to ground.

4. The method for implementing precise eFuse resistance measurement as recited in claim 3 further includes subtracting a resistance of the selected programmable reference resistor from the base resistance to identify said baseline resistance.

5. The method for implementing precise eFuse resistance measurement as recited in claim 3 wherein measuring an eFuse current through an eFuse path including a selected eFuse includes applying a set voltage to a network including the eFuse array with the selected eFuse and no reference resistor selected.

6. The method for implementing precise eFuse resistance measurement as recited in claim 3 wherein identifying a resistance of the selected eFuse using the measured eFuse current and said network baseline resistance includes dividing the set voltage by the measured eFuse current, and subtracting said baseline resistance to identify the resistance of the selected eFuse.

7. A circuit for implementing precise eFuse resistance measurement with an eFuse array comprising:

an eFuse sense amplifier coupled to the eFuse array, said eFuse sense amplifier including balanced odd and even bitlines and a plurality of programmable reference resistors coupled to the balanced odd and even bitlines, a wordline decoder and a bitline decoder coupled to the eFuse array for selecting an eFuse;

a reference decoder coupled to said eFuse sense amplifier for selecting one of said programmable reference resistors;

said eFuse sense amplifier measuring a baseline current through the selected one of said programmable reference resistors, said measured baseline current for identifying a network baseline resistance using the measured baseline current;

said eFuse sense amplifier measuring an eFuse current through an eFuse path including the selected eFuse for identifying a resistance of the selected eFuse using the measured eFuse current and said network baseline resistance.

8. The circuit for implementing precise eFuse resistance measurement as recited in claim 7 wherein each said respective eFuse includes a series connected eFuse and a select transistor.

9. The circuit for implementing precise eFuse resistance measurement as recited in claim 8 wherein a wordline select signal from said wordline decoder is applied to a gate input of said select transistor.

10. The circuit for implementing precise eFuse resistance measurement as recited in claim 8 wherein said balanced odd and even bitlines include a plurality of eFuses of the eFuse array connected to each of said odd bitline and said even bitline.

11. The circuit for implementing precise eFuse resistance measurement as recited in claim 10 wherein respective odd and even bitline select inputs from said bitline decoder are applied to each said respective eFuse in the eFuse array.

12. The circuit for implementing precise eFuse resistance measurement as recited in claim 7 includes a calculation function identifying said resistance of the selected eFuse using the measured eFuse current and said network baseline resistance.

13. A design structure tangibly embodied in a machine readable medium used in a design process, the design structure comprising:

an eFuse resistance measurement circuit connected to an eFuse array; said eFuse resistance measurement circuit including an eFuse sense amplifier coupled to the eFuse array, said eFuse sense amplifier including balanced odd and even bitlines and a plurality of programmable reference resistors coupled to the balanced odd and even bitlines, a wordline decoder and a bitline decoder coupled to the eFuse array for selecting an eFuse;

a reference decoder coupled to said eFuse sense amplifier for selecting one of said programmable reference resistors;

said eFuse sense amplifier measuring a baseline current through the selected one of said programmable reference resistors, said measured baseline current for identifying a network baseline resistance using the measured baseline current;

said eFuse sense amplifier measuring an eFuse current through an eFuse path including the selected eFuse for identifying a resistance of the selected eFuse using the measured eFuse current and said network baseline resistance, wherein the design structure, when read and used in the manufacture of a semiconductor chip produces a chip comprising the eFuse resistance measurement circuit.

14. The design structure of claim 13, wherein the design structure comprises a netlist, which describes the eFuse resistance measurement circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, wherein each said respective eFuse includes a series connected eFuse and a select transistor.

18. The design structure of claim 17, wherein a wordline select signal from said wordline decoder is applied to a gate input of said select transistor.

19. The design structure of claim 17, wherein said balanced odd and even bitlines include a plurality of eFuses of the eFuse array connected to each of said odd bitline and said even bitline.

20. The design structure of claim 19, wherein respective odd and even bitline select inputs from said bitline decoder are applied to each said respective eFuse in the eFuse array.

* * * * *